United States Patent
Kang et al.

(10) Patent No.: US 12,010,874 B2
(45) Date of Patent: Jun. 11, 2024

(54) DISPLAY APPARATUS, DISPLAY PANEL AND ELECTRONIC APPARATUS

(71) Applicant: LG Display Co., Ltd., Seoul (KR)

(72) Inventors: Jieun Kang, Paju-si (KR); Jung-Min Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/993,745

(22) Filed: Nov. 23, 2022

(65) Prior Publication Data

US 2023/0217709 A1     Jul. 6, 2023

(30) Foreign Application Priority Data

Dec. 31, 2021   (KR) .......................... 10-2021-0194528

(51) Int. Cl.
*H10K 59/121*    (2023.01)
*G09G 3/3233*    (2016.01)

(52) U.S. Cl.
CPC ....... *H10K 59/1213* (2023.02); *G09G 3/3233* (2013.01); *G09G 2300/0819* (2013.01); *G09G 2300/0842* (2013.01); *G09G 2320/0233* (2013.01)

(58) Field of Classification Search
CPC ........... H10K 59/00–95; H10K 59/131; H10K 59/88; H10K 59/1213; H10K 59/65; H10K 59/353; H10K 59/12; H10K 59/121; H10K 59/123; H10K 59/10; G06F 3/041–047; G06F 2203/041–04114; G09G 3/3233; G09G 2300/0413
See application file for complete search history.

(56) References Cited

U.S. PATENT DOCUMENTS

| | | | |
|---|---|---|---|
| 9,823,729 B2 | 11/2017 | An et al. | |
| 9,911,379 B2 | 3/2018 | Kim et al. | |
| 11,238,785 B2 | 2/2022 | Kim | |
| 2016/0124491 A1 | 5/2016 | An et al. | |
| 2016/0217733 A1 | 7/2016 | Kim et al. | |
| 2019/0108789 A1* | 4/2019 | Tsuge | G09G 3/3233 |
| 2020/0098332 A1* | 3/2020 | Zhang | G09G 5/003 |
| 2020/0211474 A1* | 7/2020 | Kim | G09G 3/3225 |
| 2021/0304663 A1 | 9/2021 | Kim | |
| 2021/0385314 A1* | 12/2021 | An | G06F 1/1618 |

FOREIGN PATENT DOCUMENTS

| | | |
|---|---|---|
| KR | 10-2018-0066934 A | 6/2018 |
| KR | 10-2021-0049618 A | 5/2021 |
| KR | 10-2264270 B1 | 6/2021 |
| KR | 10-2288351 B1 | 8/2021 |
| KR | 10-2021-0120165 A | 10/2021 |
| KR | 10-2435475 B1 | 8/2022 |

* cited by examiner

*Primary Examiner* — Sanjiv D. Patel
(74) *Attorney, Agent, or Firm* — Fenwick & West LLP

(57) ABSTRACT

The present disclosure provides a display apparatus, a display panel and an electronic apparatus. The display apparatus comprises a display panel and a camera unit formed on a lower portion of the display panel, wherein the display panel includes a display area including a plurality of sub-pixels and a non-display area positioned on at least one side of the display area, the display area includes a first display area and a second display area overlapped with the camera unit, and the number of light emitting elements provided in a unit area of the first display area is greater than the number of light emitting elements provided in the unit area of the second display area.

15 Claims, 5 Drawing Sheets

DISPLAY APPARATUS, DISPLAY PANEL AND ELECTRONIC APPARATUS

CROSS-REFERENCE TO RELATED APPLICATIONS

This application claims the benefit of the Korean Patent Application No. 10-2021-0194528 filed on Dec. 31, 2022, which is hereby incorporated by reference as if fully set forth herein.

FIELD OF THE INVENTION

The present disclosure relates to a display apparatus.

DISCUSSION OF THE RELATED ART

With the advancement of the information age, the demand for a display apparatus for displaying an image has increased with various forms. Therefore, various types of display apparatuses such as a liquid crystal display (LCD), a plasma display panel (PDP) and an electroluminescence display (ELD) have been recently used. The electroluminescence display apparatus may include a display apparatus such as an organic light emitting display (OLED) and a quantum-dot light emitting display (QLED).

Among the display apparatuses, the electroluminescence display apparatus is a self-light emitting type, and has advantages in that a viewing angle and a contrast ratio are more excellent than those of the liquid crystal display (LCD). Also, since the electroluminescence display apparatus does not require a separate backlight, it is advantageous that the electroluminescence display apparatus is able to be thin and lightweight and has low power consumption. Furthermore, the electroluminescence display apparatus has advantages in that it may be driven at a low direct current voltage, has a fast response speed and especially has a low manufacturing cost.

Meanwhile, in an electronic apparatus that includes an electroluminescence display apparatus, the electroluminescent display apparatus may include a display area provided with a pixel and a camera disposed in an area overlapped with the display area. When the camera operates and then the pixel overlapped with the camera emits light, a problem may occur in that photographing quality of the camera is degraded by light emitted from the pixel. In the related art, in order to solve the above problem, a method of increasing transmittance by omitting an anode electrode of a light emitting element in the area overlapped with the camera or omitting an entire pixel circuit of the area overlapped with the camera has been used.

However, when the method is used, in the display area, the number of pixels that emit light in the area overlapped with the camera is less than the number of pixels that emit light in the area that is not overlapped with the camera, whereby a problem may occur in that luminance of the display apparatus is reduced.

SUMMARY

The present disclosure has been made in view of the above problems and it is an object of the present disclosure to provide a display apparatus that minimizes its luminance reduction while preventing photographing quality of a camera from being deteriorated.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a display apparatus comprising a display panel and a camera unit formed on a lower portion of the display panel, wherein the display panel includes a display area including a plurality of subpixels and a non-display area positioned on at least one side of the display area, the display area includes a first display area and a second display area overlapped with the camera unit, and the number of light emitting elements provided in a unit area of the first display area is greater than the number of light emitting elements provided in the unit area of the second display area.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
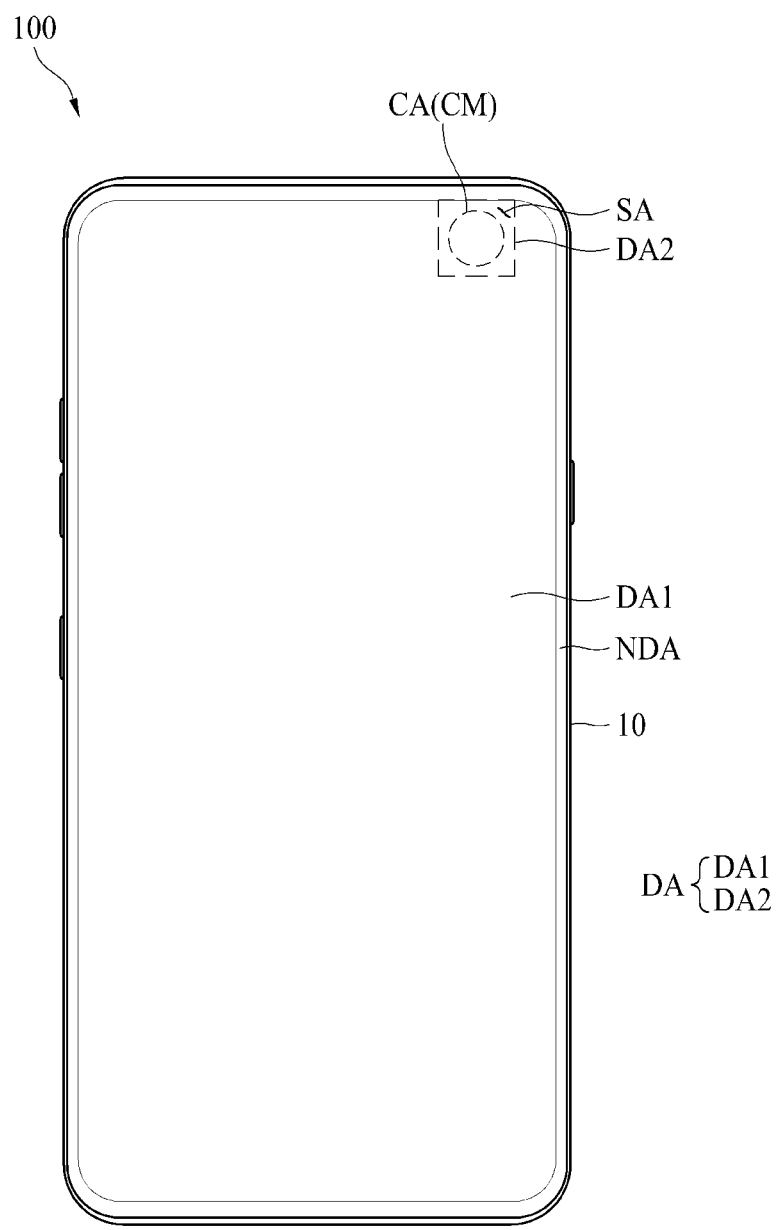
FIG. 1 is a schematic plan view illustrating a light emitting display apparatus according to one embodiment of the present disclosure.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~' and 'next to~', one or more portions may be arranged between two other portions unless 'just' or 'direct' is used.

In describing a temporal relationship, for example, when the temporal order is described as 'after~', 'subsequent', 'next~' and 'before~' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, a preferred embodiment of the present disclosure will be described in detail with reference to the accompanying drawings.

FIG. 1 is a schematic plan view illustrating a light emitting display apparatus according to one embodiment of the present disclosure.

Referring to FIG. 1, a light emitting display apparatus 100 according to one embodiment of the present disclosure may include a display panel 10 for displaying an image and a camera unit CM for photographing an image.

The light emitting display apparatus 100 may be applied to various electronic apparatuses such as a smart phone, a tablet, a smart pad, a TV, and a monitor.

The display panel 10 may be a flat display panel or a flexible display panel. A substrate of the display panel 10 may be formed of glass, plastic or plastic film, but is not limited thereto. In addition, the display panel 10 may display an image by using a pixel circuit PC disposed on the substrate and a light emitting element. The light emitting element may include, but is not limited to, an organic light emitting diode, a quantum-dot light emitting diode or an inorganic light emitting diode.

The display panel 10 may include a display area DA that includes a plurality of subpixels and a non-display area NDA positioned on at least one side of the display area DA. Referring to FIG. 1, the non-display area NDA is disposed on a portion of a front surface of the display panel 100, but is not limited thereto.

The display area DA may include first and second display areas DA1 and DA2. A plurality of pixels provided in the first display area DA1 may emit light to display an image. The second display area DA2 may overlap the camera unit CM. The second display area DA2 may include a camera area CA overlapped with the camera unit CM and a peripheral area SA adjacent to the camera area CA.

The camera unit CM may be disposed on a lower portion of the display panel 10. Referring to FIG. 1, a size of the second display area DA2 is larger than that of the camera unit CM, but is not limited thereto. For example, the second display area DA2 and the camera unit CM may be formed substantially with the same size, or the second display area DA2 may be smaller than the camera unit CM. Referring to FIG. 1, the camera unit CM is formed to overlap a right upper area of the display area DA, but is not limited thereto. For example, the camera unit CM may overlap a left upper area or a central upper area of the display area DA. In this case, the second display area DA2 may also be disposed in the left upper area or the central upper area.

Figure 2:
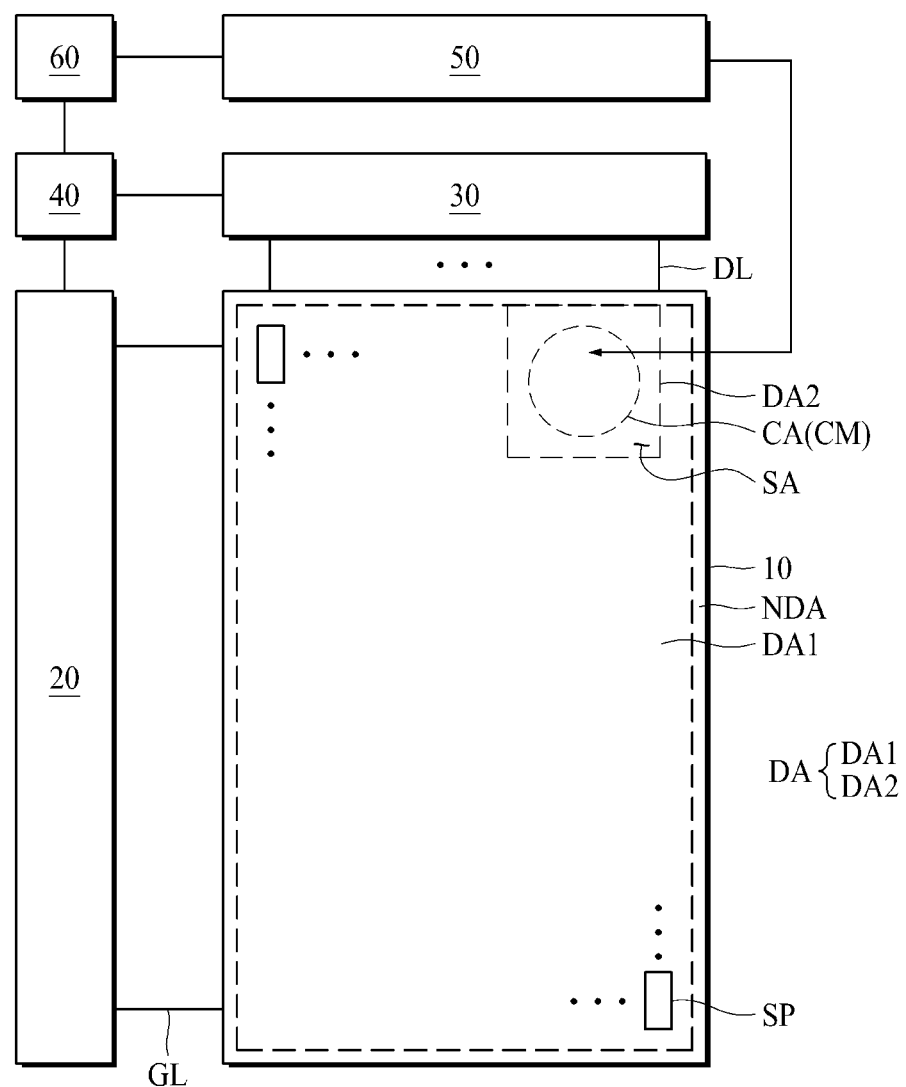
FIG. 2 is a plan view illustrating a configuration of a light emitting display apparatus according to one embodiment of the present disclosure.

FIG. 2 is a plan view illustrating a configuration of a light emitting display apparatus 100 according to one embodiment of the present disclosure.

Referring to FIG. 2, the light emitting display apparatus 100 may include a display panel 10, a gate driver 20, a data driver 30, a timing controller 40, a camera driver 50, a host processor 60 and the like. The gate driver 20 and the data driver 30 may be defined as a panel driver for driving the display panel 10. The gate driver 20, the data driver 30, the timing controller 40, the camera driver 50 and the host processor 60 may be defined as display drivers.

The display panel 10 includes a display area DA for displaying an image and a non-display area NDA positioned outside the display area DA. The display panel 10 may include a pixel array in which a plurality of pixels are arranged in the display area DA in the form of a matrix.

Each of the pixels disposed in the display area DA of the display panel 10 may include a plurality of subpixels SP that individually include light emitting elements. Each pixel may be comprised of subpixels of three colors or four colors or subpixels of two colors among a red subpixel for emitting red light, a green subpixel for emitting green light, a blue subpixel for emitting blue light, and a white subpixel for emitting white light. Each subpixel SP may be connected to a plurality of signal lines that include a gate line driven by the gate driver 20, a data line driven by the data driver 30 and a power line for supplying a power voltage, and may be independently driven by each pixel circuit.

The gate driver 20 may be supplied with a plurality of gate control signals from the timing controller 40 to perform a shift operation, thereby individually driving gate lines of the panel 10, and may be embedded in the non-display area NDA of the display panel 10.

The data driver 30 may be controlled in accordance with a data control signal supplied from the timing controller 40, may convert digital data supplied from the timing controller 40 into an analog data signal by using gamma voltages and supply a corresponding data signal to each data line of the display panel 10.

The timing controller 40 may control the gate driver 20 and the data driver 30 by using timing control signals supplied from the host processor 50 and timing setup information stored therein. The timing controller 40 may process image data supplied from the host system and supply the processed image data to the data driver 30.

The camera driver 60 may generate a camera driving signal based on a camera control signal provided from the host processor 50. The camera driver 60 may provide the camera driving signal to the camera unit CM. The camera unit CM may include at least one camera module. The camera unit CM may be controlled based on the camera driving signal provided from the camera driver 60. For example, the camera module included in the camera unit CM may photograph an image at a timing point corresponding to photographing timing information based on the camera driving signal provided from the camera driver 60. The camera unit CM may generate photographing data based on the photographed image and provide the photographed data to the host processor 50.

Figure 3:
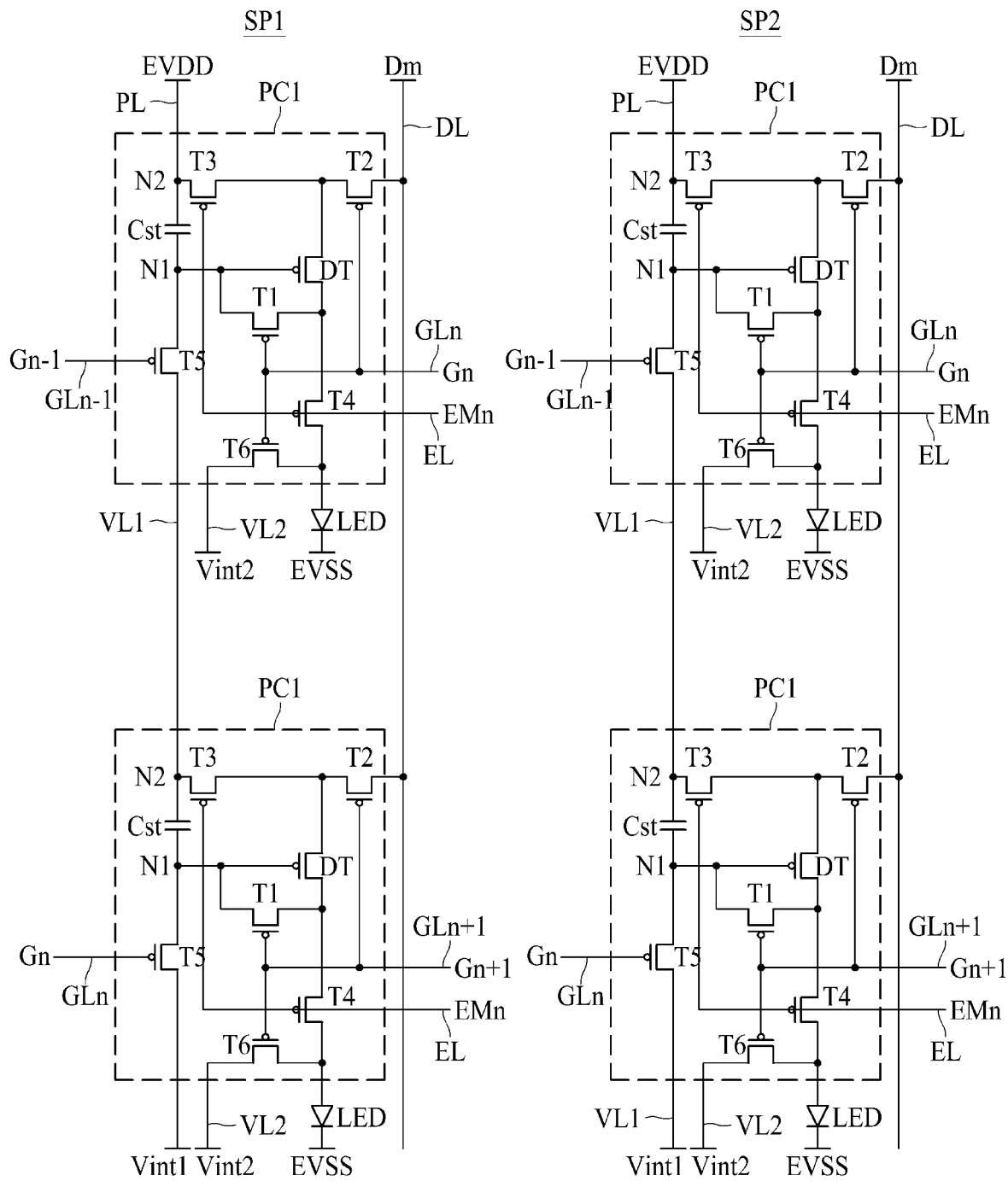
FIG. 3 is a circuit view illustrating a first display area of a light emitting display apparatus according to one embodiment of FIG. 2.

FIG. 3 is a circuit view illustrating a first display area DA1 of a light emitting display apparatus 100 according to one embodiment of FIG. 2.

The first display area DA1 may include a plurality of subpixels SP disposed in the form of a matrix, and FIG. 3 illustrates first to fourth subpixels SP1 to SP4 disposed in the form of a matrix. Each of the first to fourth subpixels SP1 to SP4 may include a light emitting element LED and a pixel circuit PC that independently drives the light emitting element LED. The light emitting element LED may be an organic light emitting diode, a quantum-dot light emitting diode, or an inorganic light emitting diode, but is not limited thereto. Hereinafter, the organic light emitting diode will be described by way of example.

Referring to FIG. 3, the first subpixel SP1 may include the light emitting element LED, and a first pixel circuit PC1 for driving the light emitting element LED. The first pixel circuit PC1 may include a driving TFT DT, a compensation TFT T1, a switching TFT T2, an operation control TFT T3, a light emission control TFT T4, an initialization TFTs T5 and T6, and a storage capacitor Cst.

The compensation TFT T1 may be turned on by a gate signal Gn supplied through a gate line GLn to connect a gate electrode with a drain electrode of the driving TFT DT, thereby connecting the driving TFT DT with a diode structure.

The switching TFT T2 may be turned on by the gate signal Gn supplied through the gate line GLn to supply a data signal Dm supplied through a data line DL to a source electrode of the driving TFT DT.

The operation control TFT T3 may be turned on by a light emission control signal EMn supplied through a light emission control line EL to connect a second node N2, to which a first power voltage EVDD is supplied through a power line PL, with the source electrode of the driving TFT DT.

The light emission control TFT T4 may be turned on by the light emission control signal EMn supplied through the emission control line EL to connect the drain electrode of the driving TFT DT with an anode electrode of the light emitting element LED.

The first initialization TFT T5 may be turned on by a previous gate signal Gn−1 supplied through a previous gate line GLn−1 to initialize a first node N1 connected to the gate electrode of the driving TFT DT to a first initialization voltage Vint1 supplied through a first initialization voltage line VL1.

The second initialization TFT T6 may initialize the anode electrode of the light emitting element LED to a second initialization voltage Vint2 supplied through a second initialization voltage line VL2 in response to the gate signal Gn supplied through the gate line GLn.

The storage capacitor Cst may charge a differential voltage between the data signal Dm supplied to the first node N1 through the driving TFT DT, the compensation TFT T1 and the switching TFT T2 and the first power voltage EVDD supplied to the second node N2 through the power line PL and supply the charged voltage to the driving TFT DT as a driving voltage.

The driving TFT DT may control a driving current flowing to the light emitting diode LED in accordance with the driving voltage charged in the storage capacitor Cst, thereby controlling light emitting intensity of the light emitting element LED in accordance with the driving current.

Therefore, the first subpixel SP1 may emit light by driving the light emitting element through the first pixel circuit PC1.

Since each of the second to fourth subpixels SP2 to SP4 of the first display area DA1 includes a first pixel circuit PC1 configured to be the same as the first subpixel SP1, its description will be omitted. Therefore, as the plurality of first pixel circuits PC1 drives the light emitting element LED, the first display area DA1 may display an image.

Figure 4:
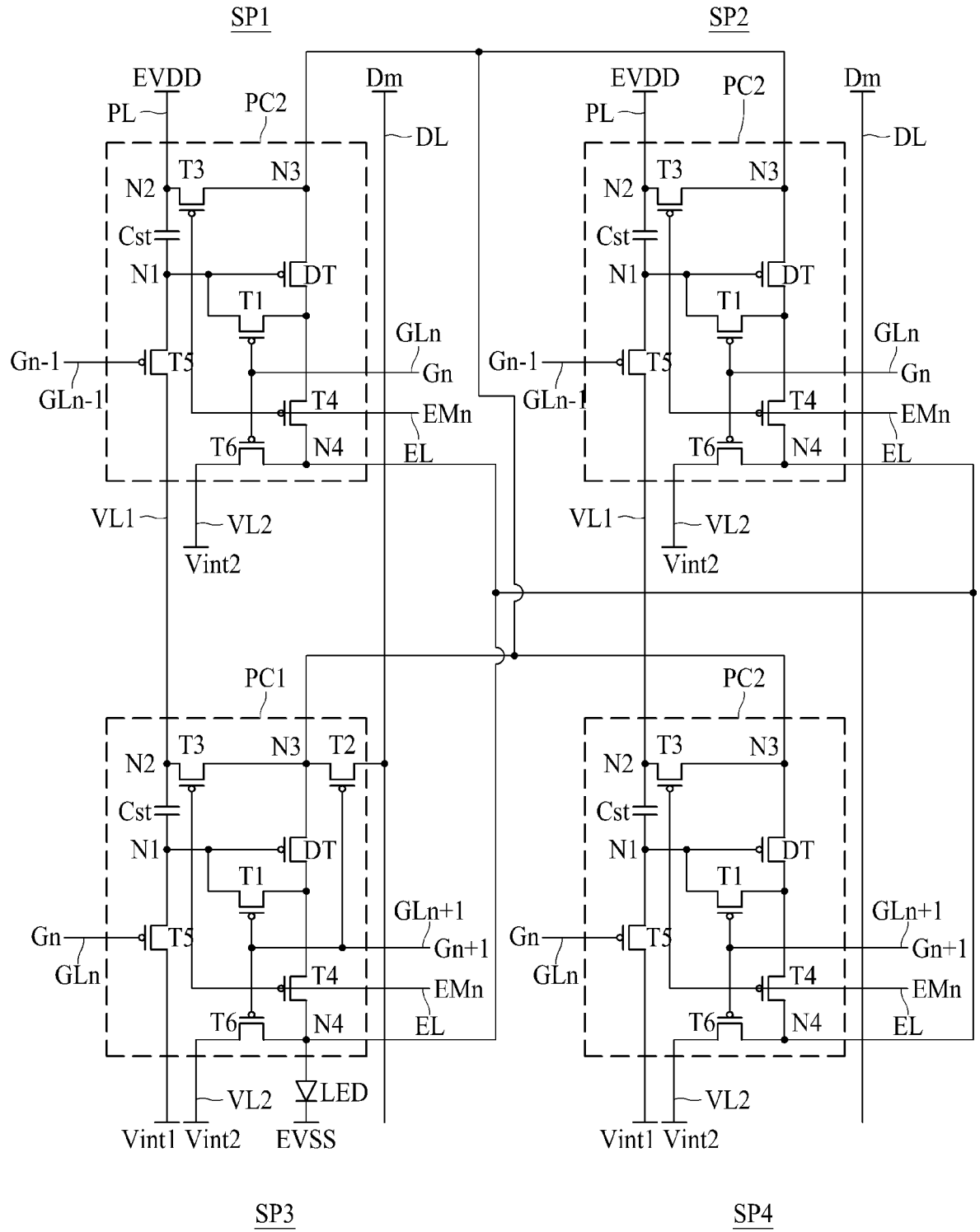
FIG. 4 is a circuit view illustrating a second display area of a light emitting display apparatus according to one embodiment of FIG. 2.

FIG. 4 is a circuit view illustrating a second display area DA2 of a light emitting display apparatus 100 according to one embodiment of FIG. 2.

The second display area DA2 may include a plurality of subpixels SP disposed in the form of a matrix, and FIG. 4 illustrates first to fourth subpixels SP1 to SP4 disposed in the form of a matrix. At least one of the first to fourth subpixels SP1 to SP4 may include a light emitting element LED and a pixel circuit PC that independently drives the light emitting element LED. The light emitting diode LED may be an organic light emitting diode, a quantum-dot light emitting diode, or an inorganic light emitting diode, but is not limited thereto. Hereinafter, the organic light emitting diode will be described by way of example.

Referring to FIG. 4, the third subpixel SP3 includes a first pixel circuit PC1, and the first, second and fourth subpixels SP1, SP2 and SP4 may include a second pixel circuit PC2. In addition, although the third subpixel SP3 includes a light emitting element LED, the first, second and fourth subpixels SP1, SP2 and SP4 may not include a light emitting diode LED. That is, the third subpixel SP3 may emit light, but the first, second and fourth subpixels SP1, SP2 and SP4 may not emit light. Therefore, the number of light emitting elements LED provided in the unit area of the second display area DA2 may be less than that provided in the unit area of the first display area DA1. Alternatively, in the first display area DA1 and the second display area DA2 with the same number of subpixels, the number of light emitting elements LED provided in the second display area DA2 may be less than that provided in the first display area DA1. Alternatively, the density of light emitting elements LED provided in the second display area DA2 may be smaller than that of light emitting elements LED provided in the first display area DA1. At this time, the camera unit CM is disposed in an area overlapped with the first, second and fourth subpixels SP1, SP2 and SP4 so that degradation of photographing quality of the camera due to light emitted from the subpixel may be minimized.

Since transistors constituting the first pixel circuit PC1 of the third subpixel SP3 include the same configuration and features as those of the transistors constituting the first pixel circuit PC1 described in FIG. 3, their description will be omitted.

The first subpixel SP1 may include a second pixel circuit PC2. The second pixel circuit PC2 may include a driving TFT DT, a compensation TFT T1, an operation control TFT T3, a light emission control TFT T4, initialization TFTs T5 and T6, and a storage capacitor Cst. That is, the second pixel circuit PC2 may be a circuit in which the switching TFT T2 is omitted from the first pixel circuit PC1. Therefore, since the switching TFT T2 is not provided, the driving TFT DT may not be supplied with the data signal Dm.

Also, since transistors constituting the second pixel circuit PC2 include the same configuration and features as those of the corresponding transistors constituting the first pixel circuit PC1 described in FIG. 3, their description will be omitted.

Since the second and fourth subpixels SP2 and SP4 of the second display area DA2 include the second pixel circuit PC2 configured in the same manner as the first subpixel SP1, a description thereof will be omitted.

In this case, the first to fourth subpixels SP1 to SP4 may be electrically connected to one another. In detail, the first and second pixel circuits PC1 and PC2 may have a third node N3 to which a drain electrode of the operation control TFT T3 and the source electrode of the driving TFT DT are connected. The third nodes N3 respectively provided in the first to fourth subpixels SP1 to SP4 may be electrically connected to one another. In this case, a current flowing to the third node N3 provided in each of the first, second and fourth subpixels SP1, SP2 and SP4 may be supplied to the third node N3 of the third subpixel SP3. Therefore, the amount of the current supplied to the driving TFT DT of the third subpixel SP3 may be increased.

In addition, the first and second pixel circuits PC1 and PC2 may have a fourth node N4 to which the light emission control TFT T4 and the second initialization TFT T6 are connected. The fourth nodes N4 respectively provided in the first to fourth subpixels SP1 to SP4 may be electrically connected to one another. In this case, the current flowing to the fourth node N4 provided in the first, second and fourth subpixels SP1, SP2 and SP4 may be supplied to the fourth node N4 of the third subpixel SP3. Therefore, the amount of current supplied to the light emitting element LED of the third subpixel SP3 may be increased.

Therefore, a circuit may be formed such that the current flowing to the first, second and fourth subpixels SP1, SP2 and SP4 flows to the third subpixel SP3, whereby the current flowing to the third subpixel SP3 may be increased. Therefore, luminance of the light emitting element LED provided in the second display area DA2 may be more improved than the light emitting element LED provided in the first display area DA1.

In the present disclosure, as the light emitting element LED is not formed in some subpixels disposed in the second display area DA2, transmittance of the second display area DA2 may be improved. Also, the current flowing to the light emitting element LED provided in the second display area DA2 may be increased more than the first display area DA1, whereby luminance of the light emitting element LED in the second display area DA2 may be improved. Therefore, overall luminance degradation of the second display area DA2 may be reduced, whereby luminance of the entire display area may be uniformly implemented.

In FIG. 4, the third subpixel SP3 includes a light emitting element LED and a first pixel circuit PC1, and the first, second and fourth subpixels SP1, SP2 and SP4 include a second pixel circuit PC2, but these subpixels are not limited thereto. For example, at least one of the first to fourth subpixels SP1 to SP4 may include a light emitting element LED and a first pixel circuit PC1, and the other subpixels may include a second pixel circuit PC2.

Figure 5:
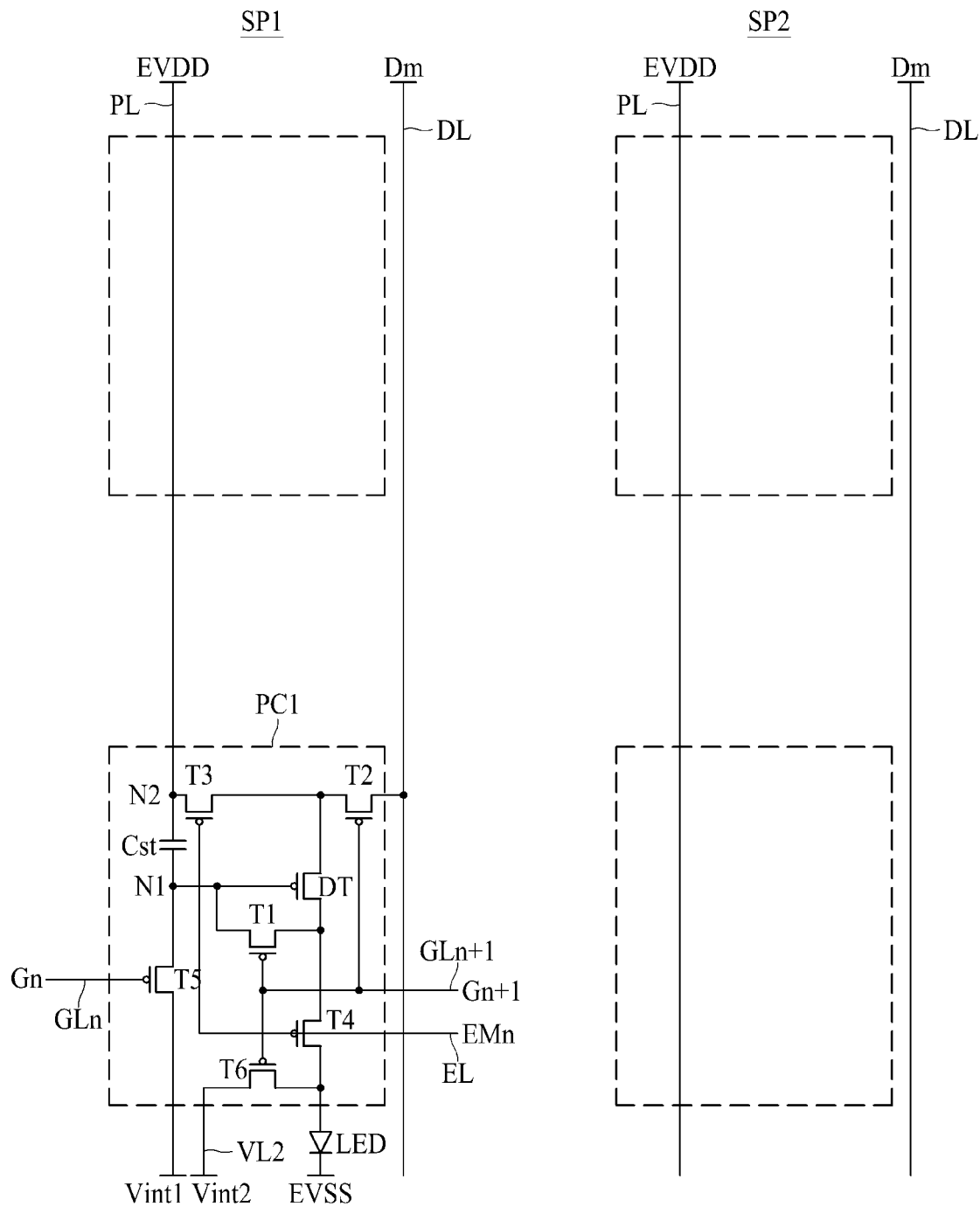
FIG. 5 is a circuit view illustrating a second display area of a light emitting display apparatus according to another embodiment of FIG. 2.

FIG. 5 is a circuit view illustrating a second display area of a light emitting display apparatus according to another embodiment of FIG. 2.

Referring to FIG. 5, the third subpixel SP3 includes a light emitting element LED and a first pixel circuit PC1, and the first, second and fourth subpixels SP1, SP2 and SP4 may not include a light emitting element LED and a pixel circuit PC. Since the first, second and fourth subpixels SP1, SP2 and SP4 do not include a light emitting element LED and a pixel circuit PC, transmittance of the second display area DA2 disclosed in FIG. 5 may be further improved.

Since transistors constituting the first pixel circuit PC1 of the third subpixel SP3 include the same configuration and features as those of the transistors constituting the first pixel circuit PC1 described in FIG. 3, their description will be omitted.

In this case, an element structure of the driving TFT DT disposed in the first pixel circuit PC1 may be changed to increase a magnitude of a current flowing to the light emitting diode LED. For example, a width of a channel area of the driving TFT DT disposed in the first pixel circuit PC1 may be increased. Therefore, the amount of current supplied to the driving TFT DT disposed in the first pixel circuit PC1 may be increased to increase the magnitude of the current supplied to the light emitting element LED.

Alternatively, the data signal Dm supplied to the first pixel circuit PC1 may be adjusted to increase the magnitude of the current flowing to the light emitting diode LED. For example, a supply algorithm of the data signal Dm supplied to the data driver 30, the timing controller 40 or the host processor 50 may be changed to adjust the data signal Dm supplied to the data line DL. At this time, a magnitude of a voltage of the data signal Dm supplied to the driving TFT DT disposed in the first pixel circuit PC1 provided in the second display area DA2 may be increased. Therefore, the amount of current supplied to the driving TFT DT disposed in the first pixel circuit PC1 may be increased, whereby the magnitude of the current supplied to the light emitting element LED may be increased.

In the present disclosure, as the light emitting element LED and the pixel circuit PC are not provided in some subpixels of the second display area DA2, transmittance of the second display area DA2 may be improved further. Also, the current flowing to the light emitting element LED provided in the second display area DA2 may be increased more than the first display area DA1, whereby luminance of the light emitting element LED may be improved. Therefore, overall luminance degradation of the second display area DA2 may be reduced, whereby luminance of the entire display area may be uniformly implemented.

In FIG. 5, the third subpixel SP3 includes a light emitting element LED and a first pixel circuit PC1, and the first, second and fourth subpixels SP1, SP2 and SP4 do not include a light emitting element LED and a pixel circuit PC, but these subpixels are not limited thereto. For example, at least one of the first to fourth subpixels SP1 to SP4 may include a light emitting element LED and a first pixel circuit PC1, and the other subpixels may not include a light emitting element LED and a pixel circuit PC.

According to the present disclosure, the following advantageous effects may be obtained.

According to the present disclosure, the current flowing to the pixel of the area overlapped with the camera may be increased to minimize luminance reduction of the display apparatus.

It will be apparent to those skilled in the art that the present disclosure described above is not limited by the above-described embodiments and the accompanying drawings and that various substitutions, modifications and variations may be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:
1. A display apparatus comprising:
 a display panel and a camera unit formed on a lower portion of the display panel,
 wherein the display panel includes a display area including a plurality of subpixels and a non-display area positioned on at least one side of the display area, the display area includes a first display area and a second display area overlapped with the camera unit, at least one of the plurality of subpixels disposed in the second display area includes the light emitting element and a first pixel circuit including a first driving transistor, other subpixels in the second display area include a second pixel circuit different from the first pixel circuit and do not include the light emitting elements, a source electrode of the first driving transistor of the first pixel circuit is directly connected to a source electrode of a second driving transistor of the second pixel circuit, the second driving transistor of the second pixel circuit driving the light emitting element of the at least one of the plurality of subpixels in the second display area, such that current of the second pixel circuit is supplied to the light emitting element or the first driving transistor of the first pixel circuit in the second display area, and the number of light emitting elements provided in a unit area of the first display area is greater than the number of light emitting elements provided in the unit area of the second display area.

2. The display apparatus of claim 1, wherein the first pixel circuit further includes:
a first transistor;
a second transistor for supplying a data signal to a source electrode of the first transistor;
a third transistor for supplying a power voltage to the source electrode of the first transistor; and
a fourth transistor for connecting a drain electrode of the first transistor with an anode electrode of the light emitting element.

3. The display apparatus of claim 2, wherein the number of transistors provided in the second pixel circuit is less than the number of transistors provided in the first pixel circuit.

4. The display apparatus of claim 3, wherein the second pixel circuit further includes:
a first transistor;
a third transistor for supplying a power voltage to a source electrode of the first transistor; and
a fourth transistor connected to a drain electrode of the first transistor.

5. The display apparatus of claim 4, wherein the first and second pixel circuits provided in the second display area are electrically connected to each other.

6. The display apparatus of claim 4, wherein the source electrodes of the first transistors respectively provided in the first and second pixel circuits in the second display area are electrically connected to each other.

7. The display apparatus of claim 4, wherein the drain electrodes of the fourth transistors respectively provided in the first and second pixel circuits in the second display area are electrically connected to each other.

8. The display apparatus of claim 2, wherein a width of a channel of the first transistor provided in the second display area is greater than a width of a channel of the first transistor provided in the first display area.

9. The display apparatus of claim 2, wherein a magnitude of a voltage of the data signal supplied to the first pixel circuit provided in the second display area is greater than a magnitude of a voltage of the data signal supplied to the first pixel circuit provided in the first display area.

10. A display panel, comprising:
a first display area comprising a plurality of subpixels, each of the subpixels in the first display area comprising a light emitting element; and
a second display area comprising a plurality of pixels, wherein a part of subpixels among the plurality of subpixels in the second display area each includes a light emitting element and a first pixel circuit including a first driving transistor, while each of other subpixels in the second display area includes a second pixel circuit different from the first pixel circuit and does not include a light emitting element, and the second display area is overlapped with a camera unit provided on a lower portion of the display panel, wherein a source electrode of the first driving transistor of the first pixel circuit is directly connected to a source electrode of a second driving transistor of the second pixel circuit, the second driving transistor of the second pixel circuit driving the light emitting element of the at least one of the plurality of subpixels in the second display area, such that current of the second pixel circuit is supplied to the light emitting element or the first driving transistor of the first pixel circuit.

11. The display panel according to claim 10, wherein the second pixel circuit is not electrically connected with a data line.

12. The display panel according to claim 11, wherein, the first and second pixel circuits provided in the second display area are electrically connected to each other.

13. The display panel according to claim 12, wherein the first pixel circuit includes:
a first transistor;
a second transistor for supplying a data signal to a source electrode of the first transistor;
a third transistor for supplying a power voltage to the source electrode of the first transistor; and
a fourth transistor for connecting a drain electrode of the first transistor with an anode electrode of the light emitting element, and
the second pixel circuit includes:
a first transistor;
a third transistor for supplying a power voltage to a source electrode of the first transistor; and
a fourth transistor connected to a drain electrode of the first transistor,
wherein the source electrodes of the first transistors respectively provided in the first and second pixel circuits in the second display area are electrically connected to each other, and/or the drain electrodes of the fourth transistors respectively provided in the first and second pixel circuits in the second display area are electrically connected to each other.

14. A display apparatus comprising the display panel according to claim 10 and the camera unit.

15. An electronic apparatus comprising the display apparatus according to claim 1.

* * * * *